(12) United States Patent
Briano

(10) Patent No.: US 11,112,465 B2
(45) Date of Patent: Sep. 7, 2021

(54) INTEGRATED CIRCUIT HAVING INSULATION MONITORING WITH FREQUENCY DISCRIMINATION

(71) Applicant: Allegro MicroSystems, LLC, Manchester, NH (US)

(72) Inventor: Robert A. Briano, Auburn, NH (US)

(73) Assignee: Allegro Microsystems, LLC, Manchester, NH (US)

( * ) Notice: Subject to any disclaimer, the term of this patent is extended or adjusted under 35 U.S.C. 154(b) by 291 days.

(21) Appl. No.: 16/267,412

(22) Filed: Feb. 5, 2019

(65) Prior Publication Data

US 2020/0249264 A1  Aug. 6, 2020

(51) Int. Cl.

| G01R 31/14 | (2006.01) |
|---|---|
| G01R 31/50 | (2020.01) |
| G01R 31/28 | (2006.01) |
| G01R 31/12 | (2020.01) |
| G01R 31/52 | (2020.01) |
| G01R 31/40 | (2020.01) |
| G01R 31/42 | (2006.01) |
| G01R 27/18 | (2006.01) |
| G01R 31/00 | (2006.01) |
| H02H 3/16 | (2006.01) |
| H02H 3/33 | (2006.01) |

(52) U.S. Cl.
CPC ............. *G01R 31/50* (2020.01); *G01R 27/18* (2013.01); *G01R 31/006* (2013.01); *G01R 31/1263* (2013.01); *G01R 31/2853* (2013.01); *G01R 31/2896* (2013.01); *G01R 31/40* (2013.01); *G01R 31/42* (2013.01); *G01R 31/52* (2020.01); *H02H 3/16* (2013.01); *H02H 3/335* (2013.01)

(58) Field of Classification Search
CPC ........ G01R 31/50; G01R 31/52; G01R 31/40; G01R 31/42; G01R 27/18; G01R 31/006; G01R 31/2896; G01R 31/2853; G01R 31/1263; G01R 31/14; H02H 3/16; H02H 3/335
USPC ................ 324/500, 508, 509, 541, 544, 551
See application file for complete search history.

(56) References Cited

U.S. PATENT DOCUMENTS

| 6,252,390 | B1 | 6/2001 | Black, Jr. et al. |
|---|---|---|---|
| 6,873,065 | B2 | 3/2005 | Haigh et al. |
| 7,259,545 | B2 | 8/2007 | Stauth et al. |
| 7,768,083 | B2 | 8/2010 | Doogue et al. |
| 7,973,527 | B2 | 7/2011 | Taylor et al. |
| 8,063,634 | B2 | 11/2011 | Sauber et al. |
| 8,358,129 | B2 | 1/2013 | Imai et al. |
| 8,629,520 | B2 | 1/2014 | Doogue et al. |
| 8,952,471 | B2 | 2/2015 | Doogue et al. |

(Continued)

OTHER PUBLICATIONS

U.S. Notice of Allowance dated May 14, 2020 for U.S. Appl. No. 15/906,291; 9 Pages.

(Continued)

*Primary Examiner* — Raul J Rios Russo
(74) *Attorney, Agent, or Firm* — Daly, Crowley, Mofford & Durkee, LLP

(57) ABSTRACT

Methods and apparatus for monitoring the integrity of an insulative material. A monitoring module detects a leakage current corresponding to an injection signal into the insulative material by a signal source. An output can provide an insulation fault signal when the leakage current is greater than a given threshold.

28 Claims, 8 Drawing Sheets

(56) References Cited

U.S. PATENT DOCUMENTS

| | | | |
|---|---|---|---|
| 9,082,957 | B2 | 7/2015 | Doogue et al. |
| 9,367,386 | B2 | 6/2016 | Kaeriyama |
| 9,829,531 | B2 | 11/2017 | Alini et al. |
| 9,859,489 | B2 | 1/2018 | Doogue et al. |
| 9,941,999 | B1 | 4/2018 | Milesi et al. |
| 2006/0061350 | A1 | 3/2006 | Myers et al. |
| 2010/0020452 | A1* | 1/2010 | Gandolfi .......... H02H 3/16 361/42 |
| 2013/0033791 | A1 | 2/2013 | Alini et al. |
| 2013/0055052 | A1 | 2/2013 | Kaeriyama |
| 2014/0254050 | A1* | 9/2014 | Haines .......... H02H 3/162 361/42 |
| 2016/0003887 | A1 | 1/2016 | Nagase |
| 2017/0054286 | A9* | 2/2017 | Haines .......... G01R 31/50 |
| 2017/0110652 | A1 | 4/2017 | Doogue et al. |
| 2017/0160761 | A1* | 6/2017 | Chan .......... G05F 1/66 |
| 2018/0076176 | A1 | 3/2018 | Latham et al. |
| 2018/0076909 | A1 | 3/2018 | Latham et al. |
| 2019/0096910 | A1 | 3/2019 | Imanishi |
| 2020/0091707 | A1* | 3/2020 | Li .......... H01H 83/00 |
| 2021/0006060 | A1* | 1/2021 | Li .......... G01R 31/58 |

OTHER PUBLICATIONS

U.S. Appl. No. 15/906,291, filed Feb. 27, 2018, Briano et al.
U.S. Appl. No. 15/363,208, filed Nov. 29, 2016, Latham et al.
U.S. Appl. No. 15/671,357, filed Aug. 8, 2017, Briano.
U.S. Appl. No. 15/705,487, filed Sep. 15, 2017, Briano.
U.S. Appl. No. 15/909,178, filed Mar. 1, 2018, Milesi et al.
U.S. Appl. No. 15/689,185, filed Aug. 29, 2017, Chetlur et al.
U.S. Appl. No. 15/801,679, filed Nov. 2, 2017, Briano.
Jim Daughton, "Spin-Dependent Sensors," Proceedings of the IEEE, vol. 91, No. 5; May 2003; pp. 681-686; 6 Pages.
Bender GmbH, ISOMETER® IR155-3203/IR155-3204 Product Data Sheet; Insulation Monitoring Device (IMD) for Unearthed DC Drive Systems (IT Systems) in Electric Vehicles; Version V004; Feb. 2018; 6 Pages.
U.S. Appl. No. 16/430,849, filed Jun. 4, 2019, Briano et al.
Daughton et al., "Applications of Spin Dependent Transport Materials;" Journal of Physics D Applied Physics, vol. 32, No. 22; Nov. 1999; pp. R169-R177; 9 Pages.
Extended European Search Report dated Jun. 28, 2019 for European Application No. 19158387.1; 8 Pages.
Response to Official Communication dated Sep. 2, 2019 and Extended European Search Report (EESR) dated Jun. 28, 2019 for European Application No. 19158387.1; Response filed Feb. 25, 2020; 13 Pages.

* cited by examiner

INTEGRATED CIRCUIT HAVING INSULATION MONITORING WITH FREQUENCY DISCRIMINATION

BACKGROUND

As is known in the art, circuits, systems, motors, batteries, etc., can include an insulative material for electrical isolation. As the insulative material wears out, the electrical isolation of the insulated element can be degraded. In some cases, breakdown of the insulative material may create dangerous conditions.

Some conventional insulation monitoring techniques monitor leakage current in insulating materials using board level circuits with complex algorithms to detect the leakage current in noisy environments. Other known methods to monitor insulation integrity monitor the impedance indirectly by measuring residual current in a high voltage circuit and inferring that the residual current is a result of degraded insulation. Residual current is the difference between current flowing out of a node into the high voltage circuit and the current flowing into the node.

SUMMARY

The present invention provides method and apparatus for monitoring the impedance of an insulative material, which can be used to isolate high voltage circuits from low voltage circuits, provide safety from electrical shock, insulate batteries and battery terminals, insulate motor windings and the like. The impedance of an insulator barrier can be measured to determine leakage current. In embodiments, a device can be coupled to a capacitive structure and a circuit to send a known voltage signal of known frequency across an isolation barrier. A leakage current can be monitored and processes to detect insulation wear out using frequency discrimination.

In one aspect an integrated circuit package comprises: a first I/O pin configured to be coupled to an insulative material; a second I/O pin configured to output an insulation fault signal; and a monitoring module coupled to the first I/O pin, the monitoring module comprising a filter module and a current detection module configured to detect a leakage current on the first I/O pin corresponding to an injected signal into the insulative material by a signal source, the monitoring module further comprising an output module configured to output an active state on the insulation fault signal when the leakage current is greater than a given threshold.

An integrated circuit package can further include one or more of the following features: an impedance component coupled to the first I/O pin, the impedance component is formed as part of an integrated circuit in the integrated circuit package, the integrated circuit package includes an integrated circuit, and the impedance component is external to the integrated circuit, the injection signal has a selected frequency and/or frequency band, a sense resistor coupled to the first I/O pin, the monitoring module further includes a rectifier coupled to the filter module, the rectifier comprises a synchronous rectifier, a voltage divider component coupled to the signal source, the monitoring module is further configured to discriminate signals not in the same frequency and/or phase with the injected signal, an integrated circuit die disposed between a die paddle and a first conductive plate, a dielectric plate disposed between the first conductive plate and a second conductive plate, wherein the first and second conductive plates and the dielectric plate forms a capacitor coupled to the first I/O pin, a first bond pad disposed on the second conductive plate, wherein the first bond pad is coupled to the first I/O pin, a connection from the second I/O pin to a second bond pad on the integrated circuit die, the integrated circuit die comprises at least a portion of the monitoring module, and/or the monitoring module is further configured to combine multiple injected signals from multiple insulative materials.

In another aspect, a method comprises: employing a first I/O pin configured to be coupled to an insulative material; employing a second I/O pin configured to output an insulation fault signal; and employing a monitoring module coupled to the first I/O pin, the monitoring module comprising a filter module and a current detection module configured to detect a leakage current on the first I/O pin corresponding to an injected signal into the insulative material by a signal source, the monitoring module further comprising an output module configured to output an active state on the insulation fault signal when the leakage current is greater than a given threshold.

A method can further include one or more of the following features: employing an impedance component coupled to the first I/O pin, the impedance component is formed as part of an integrated circuit in an integrated circuit package, the injection signal has a selected frequency and/or frequency band, employing a sense resistor coupled to the first I/O pin, the monitoring module further includes a rectifier coupled to the filter module, the rectifier comprises a synchronous rectifier, employing a voltage divider component coupled to the signal source, the monitoring module is further configured to discriminate signals not in the same frequency and/or phase with the injected signal, employing an integrated circuit die disposed between a die paddle and a first conductive plate, a dielectric plate disposed between the first conductive plate and a second conductive plate, wherein the first and second conductive plates and the dielectric plate forms a capacitor coupled to the first I/O pin, employing a first bond pad disposed on the second conductive plate, wherein the first bond pad is coupled to the first I/O pin, and/or employing a connection from the second I/O pin to a second bond pad on the integrated circuit die.

In a further aspect, an integrated circuit package comprises: a first I/O pin configured to be coupled to an insulative material; a second I/O pin configured to output an insulation fault signal; and a monitoring means coupled to the first I/O pin for detecting a leakage current on the first I/O pin corresponding to an injected signal into the insulative material by a signal source.

An integrated circuit package can further include one or more of the following features: an impedance component coupled to the first I/O pin, the impedance component is formed as part of an integrated circuit in the integrated circuit package, the integrated circuit package includes an integrated circuit, and the impedance component is external to the integrated circuit, the injection signal has a selected frequency and/or frequency band, a sense resistor coupled to the first I/O pin, the monitoring means further includes a rectifier coupled to the filter module, the rectifier comprises a synchronous rectifier, a voltage divider component coupled to the signal source, the monitoring means is further configured to discriminate signals not in the same frequency and/or phase with the injected signal, an integrated circuit die disposed between a die paddle and a first conductive plate, a dielectric plate disposed between the first conductive plate and a second conductive plate, wherein the first and second conductive plates and the dielectric plate forms a capacitor coupled to the first I/O pin, a first bond pad disposed on the second conductive plate, wherein the first bond pad is coupled to the first I/O pin, a connection from the second I/O pin to a second bond pad on the integrated circuit die, the integrated circuit die comprises at least a portion of the monitoring module, and/or the monitoring module is further configured to combine multiple injected signals from multiple insulative materials.

BRIEF DESCRIPTION OF THE DRAWINGS

The foregoing features of this invention, as well as the invention itself, may be more fully understood from the following description of the drawings in which.

DETAILED DESCRIPTION

Figure 1:
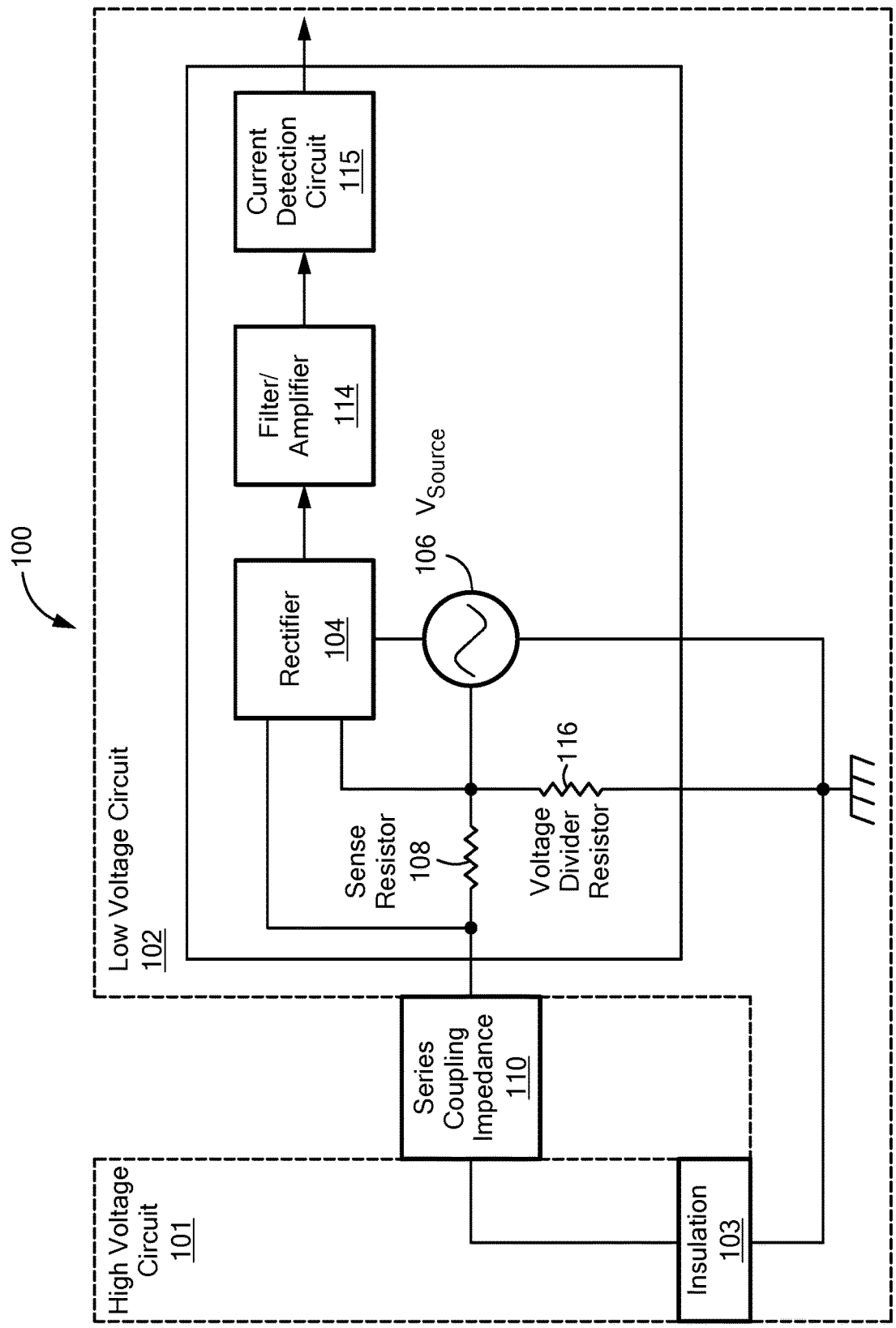
FIG. 1 is a schematic representation of an insulation monitoring system.

FIG. 1 shows a system 100 including high and low voltage circuits for monitoring insulation characteristics. In the illustrated embodiment, the system 100 includes a first circuit 101, which can be a high voltage circuit, and a second circuit 102, which can be a low voltage circuit. It is understood that high voltage and low voltage are relative terms not intended to limit the invention in any way. The second circuit 102 can provide monitoring of an insulative material 103 in the first circuit 101, which has a given impedance.

In embodiments, a signal source 106 sends a signal of selected current, voltage and frequency through a sense resistor 108 that is coupled to a first impedance component 110, which is illustrated as a capacitor, placed between the first and second circuits 101, 102. In the illustrated embodiment, the first impedance component 110 is coupled between the sense resistor 108 and the insulative material 103. The sense resistor 108 can be coupled across inputs to a rectifier 104, such as a synchronous rectifier. A filter/amplifier 114 can receive the output of the rectifier 104 and provide an output to a current detection circuit 115. In embodiments, a voltage divider resistor 116, such as a resistor, can be coupled to a node between the sense resistor 108 and the voltage source 106.

When the insulator 103 has a sufficiently high impedance associated with desired insulative characteristics, current flow through the sense resister 108 is less than a given threshold. As the insulative material 110 degrades, the impedance of the insulation 112 decreases so that the current flow through the sense resistor 108 increases, which increases a voltage drop across the sense resistor. This voltage drop signal across the sense resistor 108 corresponds to the frequency of voltage source 106 signal injected into the insulative material 103. An increase in the current across the sense resistor 108 results from a reduction in the insulating material 112 impedance. If the current increases above a given threshold, the insulation impedance may be considered faulty.

It will be appreciated that noise may be present in the circuitry near the isolation barrier due to large voltage swings at various frequencies, e.g., from switching power FETs in motor drive applications, high power line voltages, and the like. Noise in the high voltage circuits associated with the insulative material 103 will inject current across the first impedance component 110 and sense resistor 108. The second circuit 102 should reject this noise based on at least frequency.

The second circuit 102 can discriminate signals that are not generated by the signal source 106 using a variety of circuit techniques, such as lock-in amplifiers, AM demodulation, and the like. In one embodiment, a synchronous rectifier 104 is coupled across the sense resistor 108. As is known in the art, the synchronous rectifier 104 includes actively controlled switches instead of diodes to reduce the effects of diode voltage drops in passive rectifiers.

The filter/amplifier 114 differentiates the signal at the known frequency generated by the signal source 106 from noise at different frequencies. The frequency discriminating filter amplifier 114 should reject any noise, that is not at the same frequency and in phase with the signal generated by the signal source, and amplify the voltage drop at the frequency and phase of the source. The current detection module 115 interprets the discriminated voltage level as a degradation in the insulator above a selected threshold.

In embodiments, the insulation monitoring by the second circuit 102 detects changes in the insulation impedances rather than an absolute resistance of a non-leaking insulating material as in some conventional circuits.

Figure 2A:
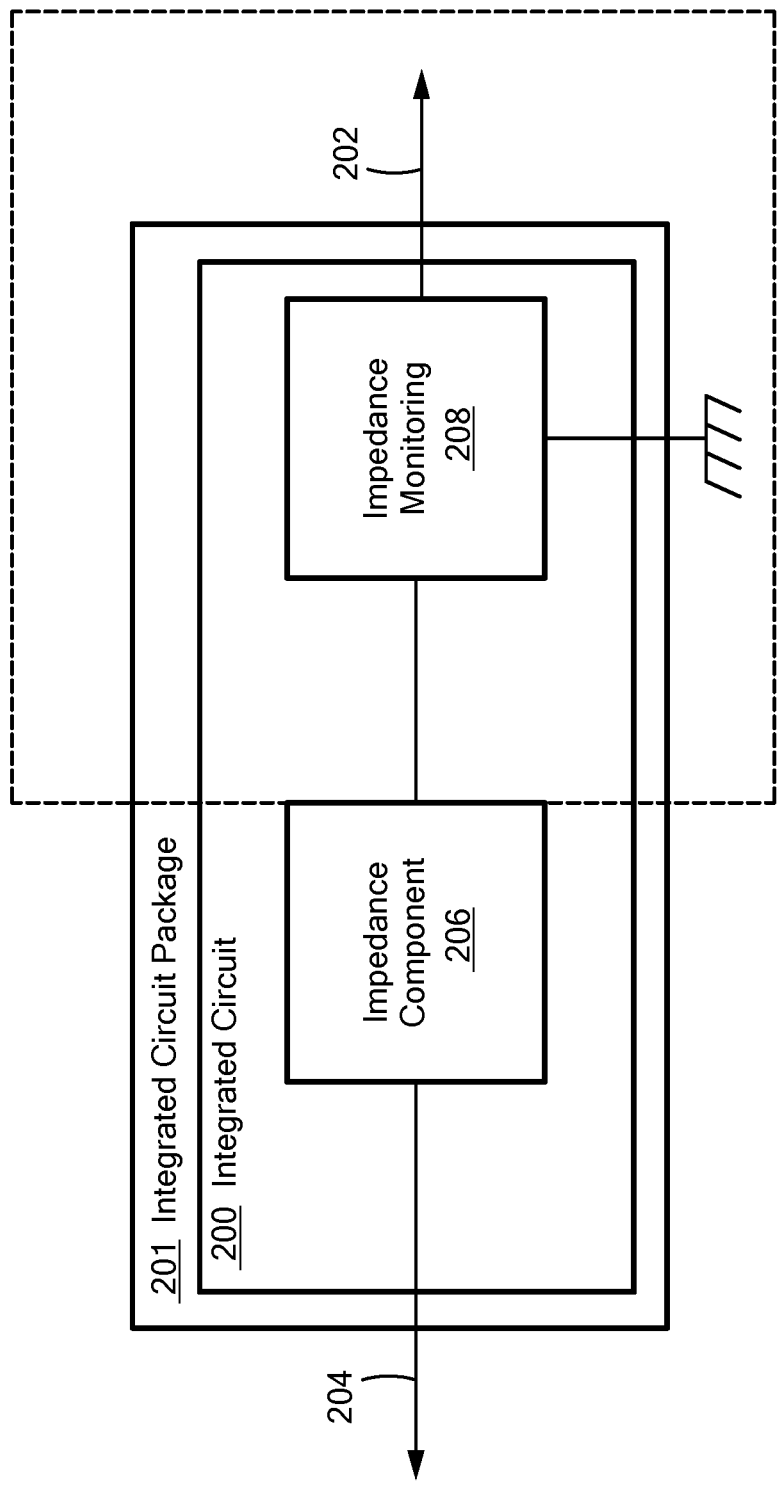
FIG. 2A is a schematic representation of an example IC package that can provide insulation monitoring.

FIG. 2A shows an example implementation of an insulation monitoring integrated circuit 200 in an IC package 201 having first and second leads 202, 204. In the illustrated embodiment, the first lead 202 provides an I/O signal indicative of whether insulation wear out is detected and the second lead 204 is configured for coupling to an insulation material (not shown). In the illustrated embodiment, the integrated circuit 200 includes a first impedance component 206, which can be similar to the capacitor 110 of FIG. 1, coupled to the sense resistor 108. The integrated circuit 200 can include impedance monitoring circuitry 208, such as circuitry shown in the second circuit 102 of FIG. 1. In embodiments, the second lead 204 is configured for connection to a high voltage circuit having a circuit or component that is electrically isolated with an insulative material for which it is desirable to monitor the insulation performance.

Figure 2B:
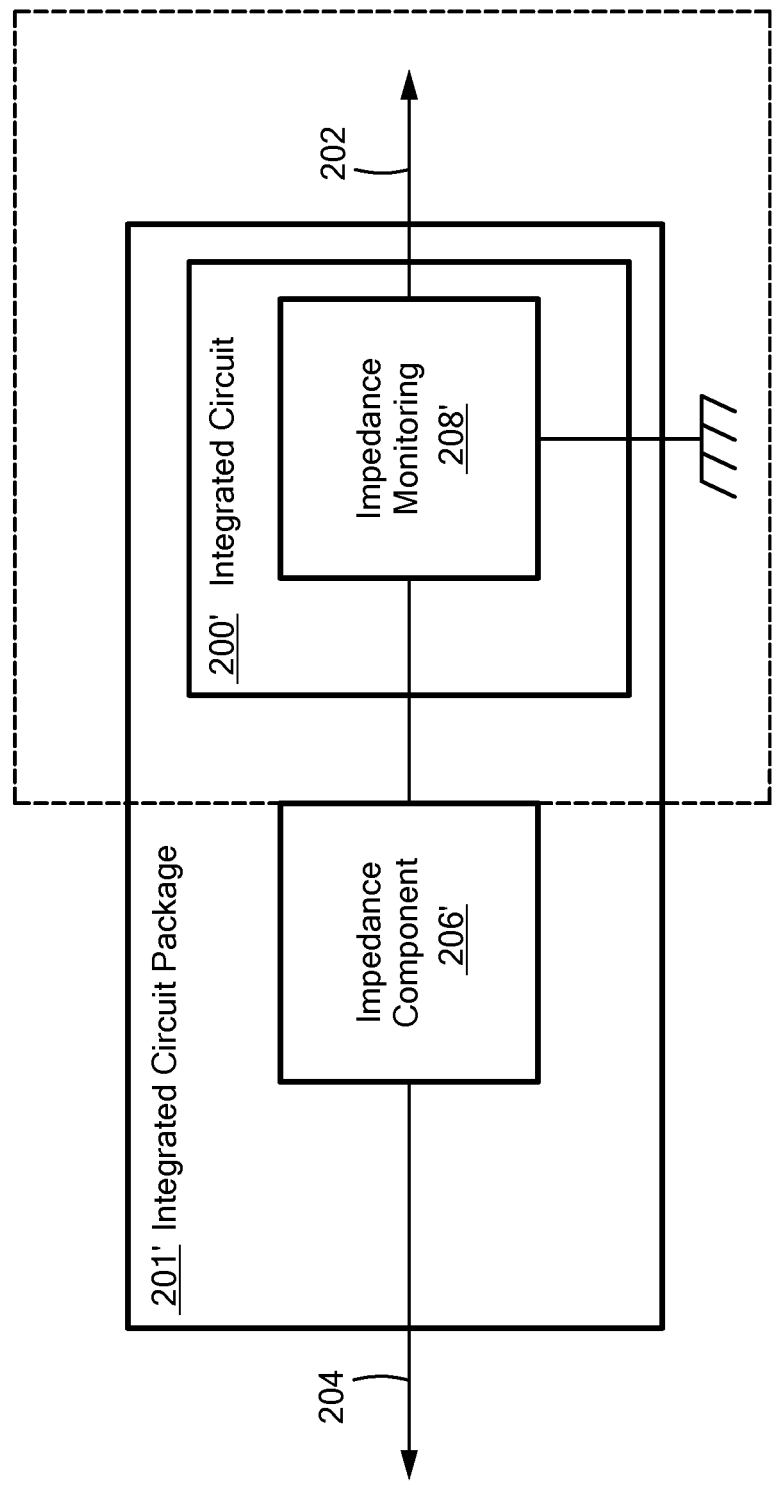
FIG. 2B is a schematic representation of a further example IC package that can provide insulation monitoring.
Figure 2C:
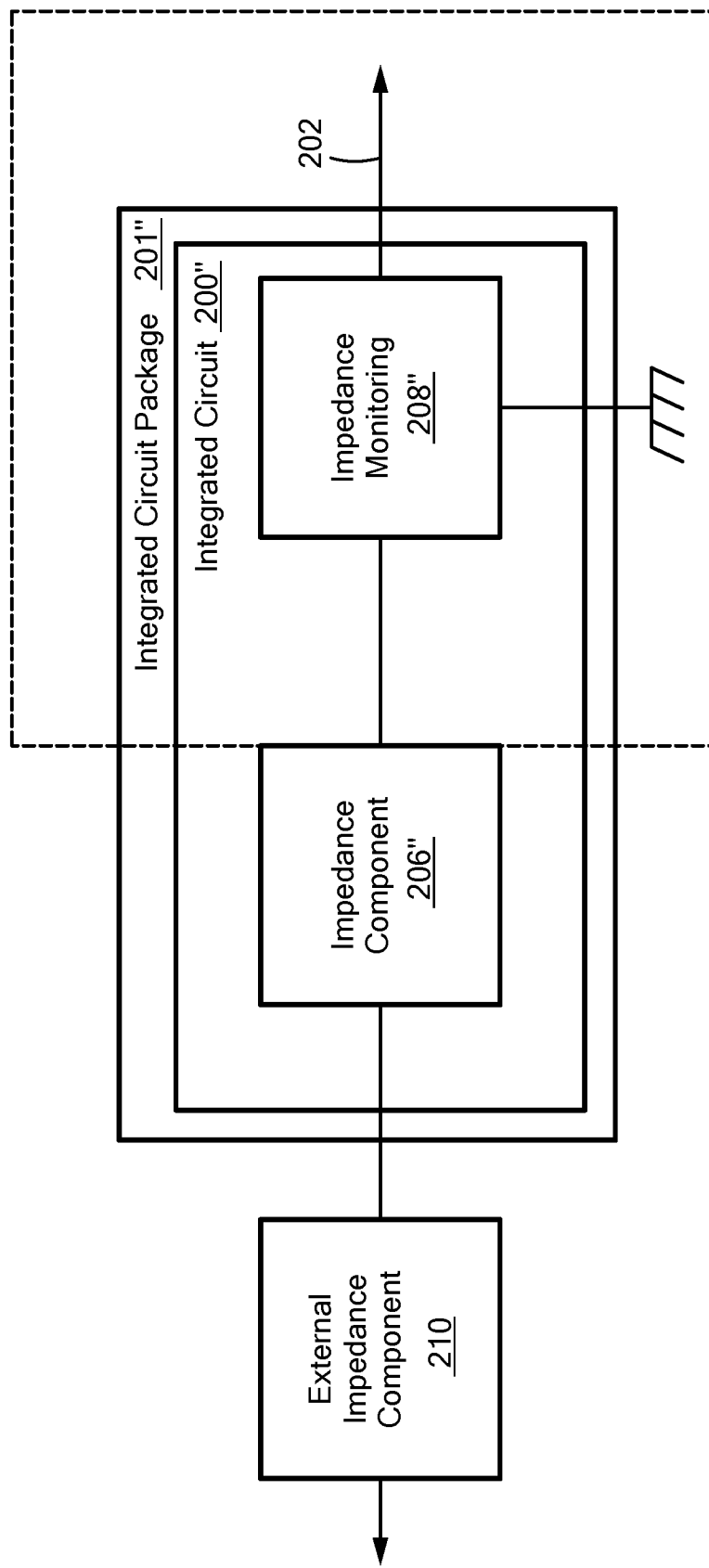
FIG. 2C is a schematic representation of a further example IC package that can provide insulation monitoring.

FIG. 2B shows an alternative embodiment in which the first impedance component 206 is external to the integrated circuit 200 but contained within the IC package 201. FIG. 2C shows a further alternative embodiment having an external impedance component 210 coupled to the internal impedance component 206'. The internal impedance component could be a simple as a conductor to connect, to the active circuitry.

Figure 3:
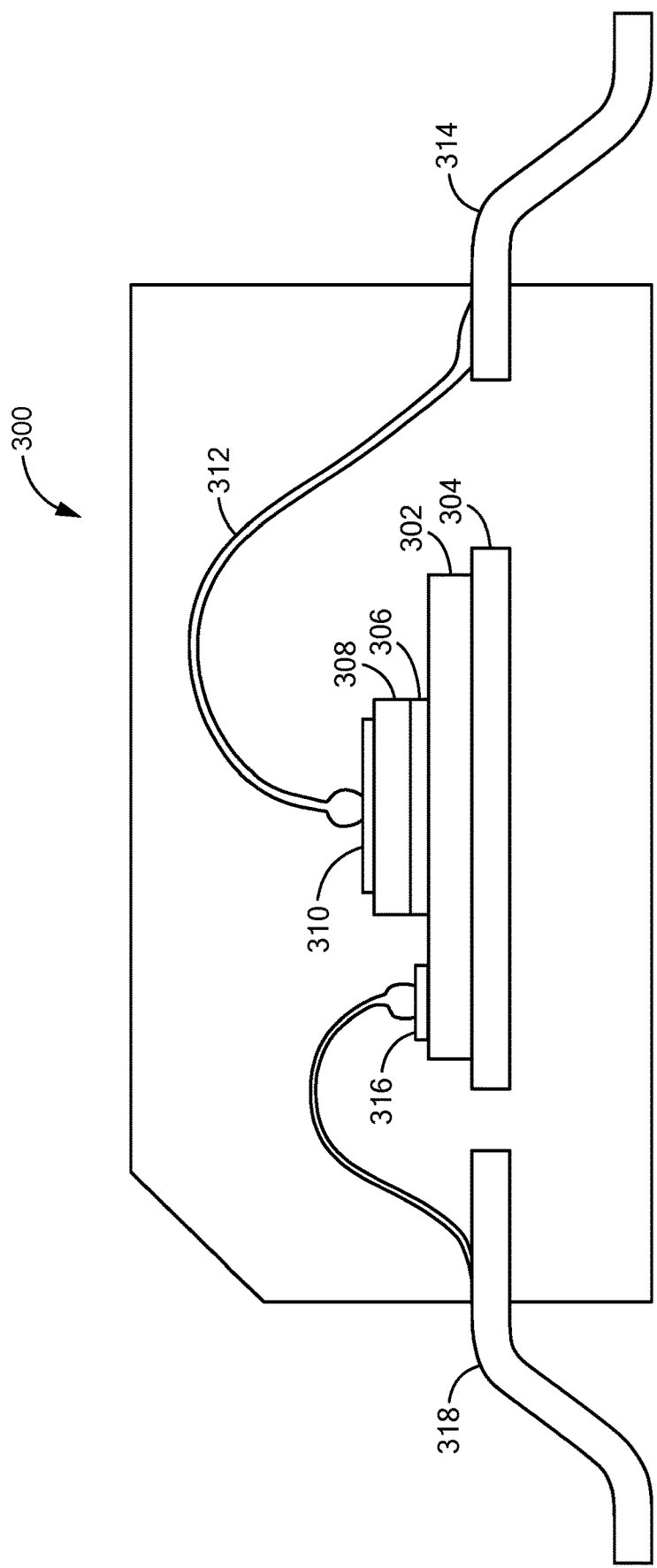
FIG. 3 is a schematic representation of a side view of an example IC package that can provide insulation monitoring.

FIG. 3 shows an IC package 300 including a die 302 disposed between a die paddle 304 and a first conductive plate 306. A dielectric material 308 is disposed between the first conductive plate 306 and a second conductive plate 310 to form a capacitor, which can provide the impedance component 206 of FIG. 2A, for example. The second conductive plate 310 comprises a first bond pad for a connection 312, such as a wirebond, to a lead 314 configured for connection to a high voltage circuit and insulation to be monitored.

A second bond pad 316 on the die 306 provides a connection to a lead 318 of the IC package generating a signal indicative of whether the insulative material has worn out more than a given threshold. The lead 318 can be connected to a processor for processing based on the state of the insulation integrity signal.

In embodiments, the die 302 can include at least some of the circuitry for monitoring characteristic of the insulative material. In embodiments, the die 302 includes circuitry shown in the monitoring circuit 102 of FIG. 1.

In embodiments, the conducive plates 306, 310 are formed by metal and the insulating dielectric material 308 can comprise oxide, ceramic, polymer or other suitable dielectric material.

Figure 4:
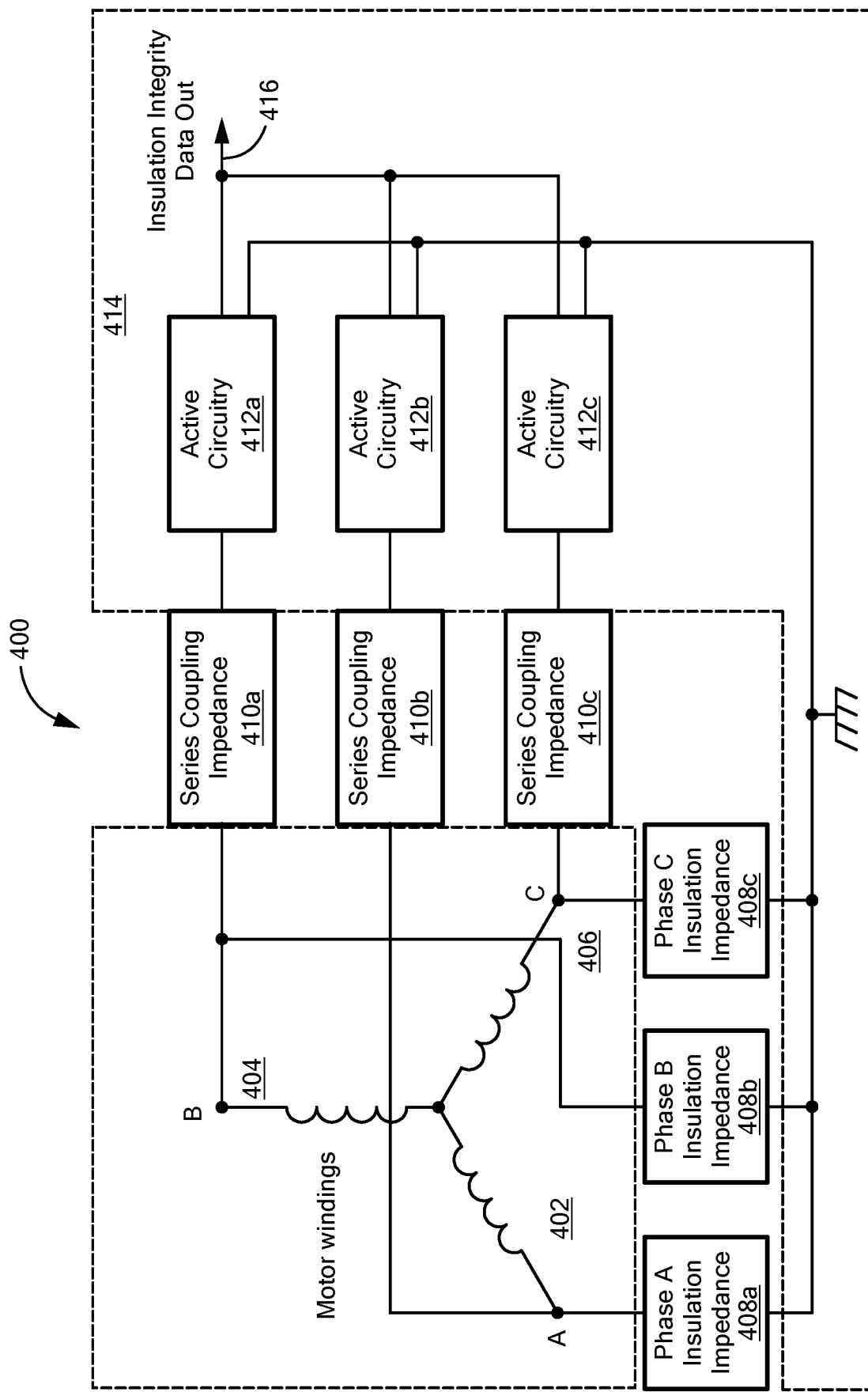
FIG. 4 is a representation of an example implementation of monitoring motor winding insulation.

FIG. 4 shows an example application of a system 400 having monitoring of winding insulation for a three-phase motor having a first phase (A) 402, a second phase (B) 404, and a third phase (C), Each of the motor phases includes respective winding insulation 408a, b, c having a respective impedance. In embodiments, each phase winding insulation 408a,b,c is coupled to a respective coupling impedance 410a,b,c each of which is coupled to a respective impedance monitoring module 412a,b,c, which can be similar to the monitoring circuit 102 of FIG. 1.

As described above, the impedance monitoring modules 412a,b,c receive a leakage current corresponding to signals having given characteristics, e.g., frequency, voltage, current, injected into the motor phase winding insulation 408a, b,c. If the winding insulations 408a,b,c have acceptable insulative/impedance properties, then the leakage current is less than a given threshold. If one or more of the winding insulations 408a,b,c is wearing out so that impedance decreases below a selected amount, the leakage current will be above the threshold.

In the illustrated embodiment, an IC package 414 can output an insulation integrity signal 416 that combines the output of the impedance monitoring modules 412a,b,c. In other embodiments, each signal can be output separately. If one or more of the insulation monitoring signals is active based upon the leakage current level from the motor winding insulation 408a,b,c, the system controller can take some action, such as motor shutdown.

It is understood that the leakage current is discriminated by frequency, for example, so that noise and signals other than the injected current do not generate a insulation breakdown detections, as described above.

Figure 5:
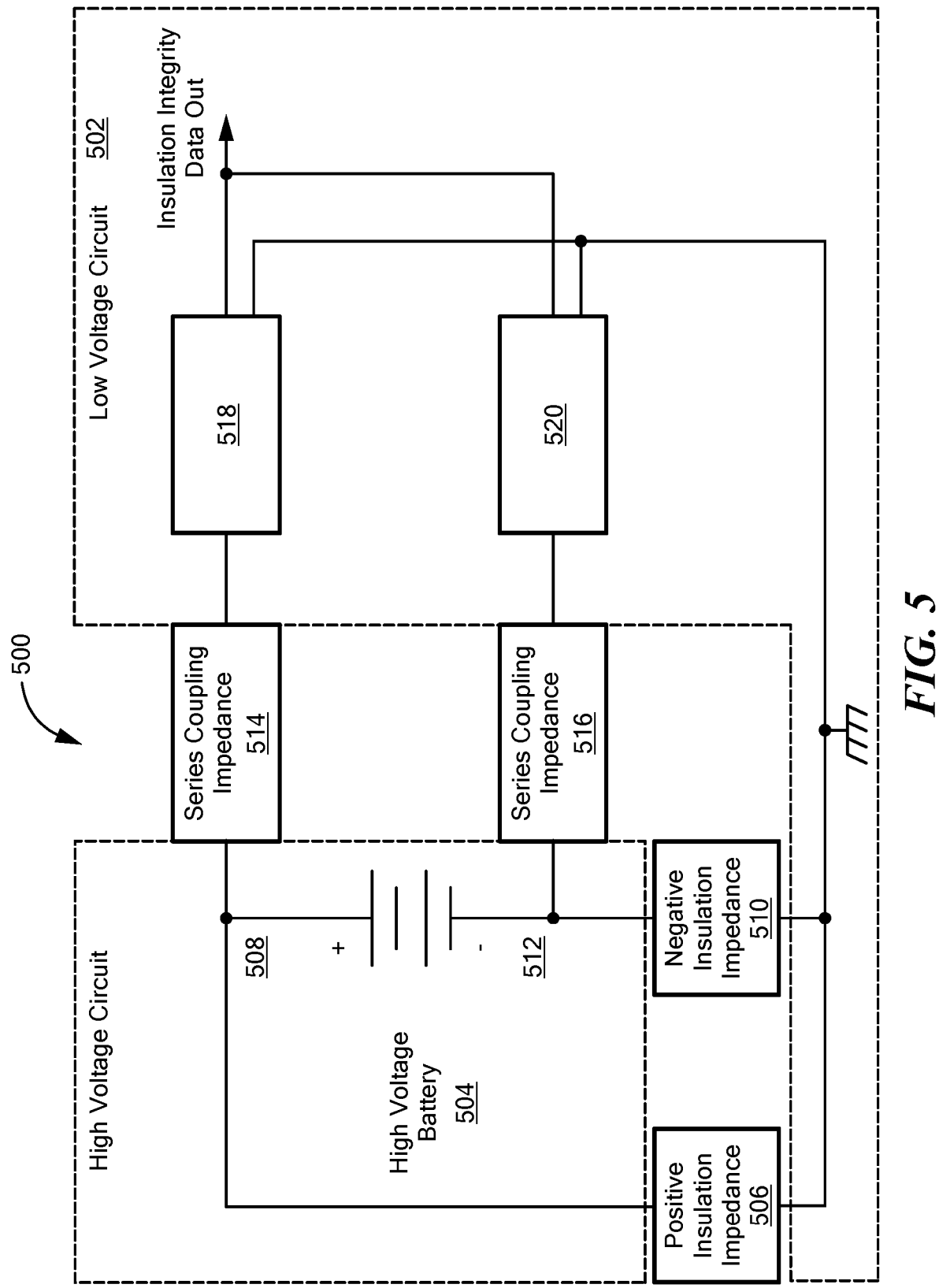
FIG. 5 is a representation of an example implementation of monitoring battery terminal insulation.

FIG. 5 shows an example battery and battery terminal insulation monitoring implementation. A battery monitoring system 500 includes an insulation monitor module 502. A battery 504 has terminals that may be insulated. In the illustrated embodiment, first insulation 506 insulates a positive terminal 508 of the battery 504 and a second insulation 510 insulates a negative terminal 512 of the battery. Respective first and second impedances 514, 516, such as capacitors, can be coupled in series across the battery 504 to provide a path from the first insulation 506 to a first impedance monitor module 518 and a path from the second insulation 510 to a second impedance monitor module 520. The first and second impedance monitoring modules 518, 520 can be similar to the circuit 102 of FIG. 1.

As in the illustrated embodiment, the battery terminal insulations 506, 508 can be modeled as a resistor coupled in series with a capacitor providing a given impedance.

Figure 6:
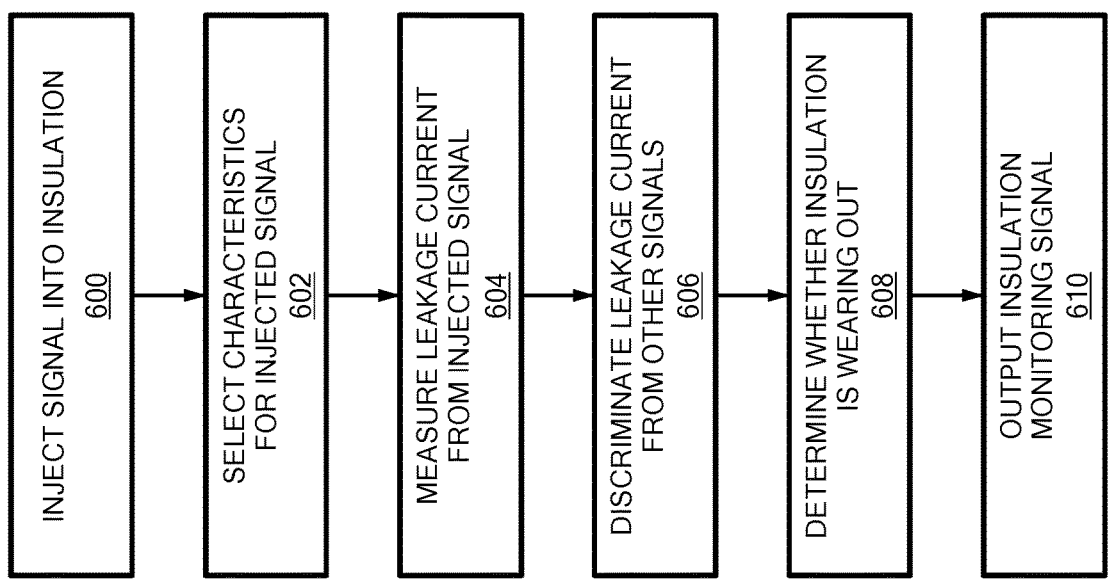
FIG. 6 is a flow diagram showing an example sequence of steps for insulation monitoring.

FIG. 6 shows an example sequence of steps for monitoring insulation. In step 600, an injection signal is injected into an insulative material. In step 602, characteristics for the injection signal are selected, such as frequency. In step 604, a leakage current corresponding to the injection signal is measured. In step 606, frequency discrimination of the leakage current signal is performed to eliminate non-injection signals from the measured leakage current. In step 606, the discriminated leakage current is processed to determine whether the insulation is wearing out based upon the leakage current level. In step 608, an insulation monitoring signal is output.

As will be understood by one skilled in the art, the impedance, such as the capacitance, of an insulating material may change due to water ingress and/or other types of environmental contamination in the material. The insulating characteristics of the material wear down over time as the impedance decreases, and thus, the material becomes less effective as an insulator. Insulation wear down should be contrasted with rapid avalanche breakdown of an insulative material.

Figure 7:
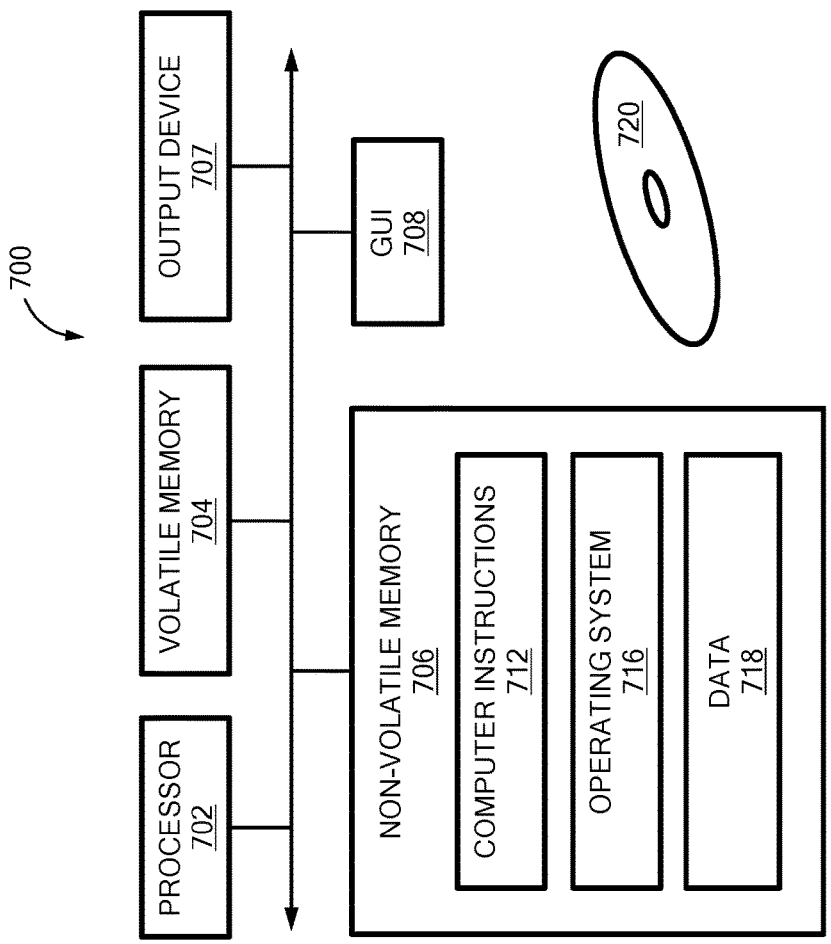
FIG. 7 is a schematic representation of an example computer that can perform at least a portion of the processing described herein.

FIG. 7 shows an exemplary computer 700 that can perform at least part of the processing described herein. For example, computer 700 and/or processor 702 can perform at least a portion of the processing in the second circuit 102 of FIG. 1, for example. The computer 700 includes a processor 702, a volatile memory 704, a non-volatile memory 706 (e.g., hard disk), an output device 707 and a graphical user interface (GUI) 708 (e.g., a mouse, a keyboard, a display, for example). The non-volatile memory 706 stores computer instructions 712, an operating system 716 and data 718. In one example, the computer instructions 712 are executed by the processor 702 out of volatile memory 704. In one embodiment, an article 720 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable sub-combination. Other embodiments not specifically described herein are also within the scope of the following claims.

What is claimed is:

1. An integrated circuit package, comprising:
a first I/O pin configured to be coupled to an insulative material;
a second I/O pin configured to output an insulation fault signal; and
a monitoring module coupled to the first I/O pin, the monitoring module comprising a filter module and a current detection module configured to detect a leakage current on the first I/O pin corresponding to an injected signal into the insulative material by a signal source, the monitoring module further comprising an output module configured to output an active state on the insulation fault signal when the leakage current is greater than a given threshold.

2. The integrated circuit package according to claim 1, further including an impedance component coupled to the first I/O pin.

3. The integrated circuit package according to claim 2, wherein the impedance component is formed as part of an integrated circuit in the integrated circuit package.

4. The integrated circuit package according to claim 2, wherein the integrated circuit package includes an integrated circuit, and the impedance component is external to the integrated circuit.

5. The integrated circuit package according to claim 1, wherein the injection signal has a selected frequency and/or frequency band.

6. The integrated circuit package according to claim 1, further including a sense resistor coupled to the first I/O pin.

7. The integrated circuit package according to claim 1, wherein the monitoring module further includes a rectifier coupled to the filter module.

8. The integrated circuit package according to claim 7, wherein the rectifier comprises a synchronous rectifier.

9. The integrated circuit package according to claim 1, further including a voltage divider component coupled to the signal source.

10. The integrated circuit package according to claim 1, wherein the monitoring module is further configured to discriminate signals not in the same frequency and/or phase with the injected signal.

11. The integrated circuit package according to claim 1, further including an integrated circuit die disposed between a die paddle and a first conductive plate, a dielectric plate disposed between the first conductive plate and a second conductive plate, wherein the first and second conductive plates and the dielectric plate forms a capacitor coupled to the first I/O pin.

12. The integrated circuit package according to claim 11, further including a first bond pad disposed on the second conductive plate, wherein the first bond pad is coupled to the first I/O pin.

13. The integrated circuit package according to claim 11, further including a connection from the second I/O pin to a second bond pad on the integrated circuit die.

14. The integrated circuit package according to claim 11, wherein the integrated circuit die comprises at least a portion of the monitoring module.

15. The integrated circuit package according to claim 1, wherein the monitoring module is further configured to combine multiple injected signals from multiple insulative materials.

16. A method, comprising:
employing a first I/O pin configured to be coupled to an insulative material;
employing a second I/O pin configured to output an insulation fault signal; and
employing a monitoring module coupled to the first I/O pin, the monitoring module comprising a filter module and a current detection module configured to detect a leakage current on the first I/O pin corresponding to an injected signal into the insulative material by a signal source, the monitoring module further comprising an output module configured to output an active state on the insulation fault signal when the leakage current is greater than a given threshold.

17. The method according to claim 16, further including employing an impedance component coupled to the first I/O pin.

18. The method according to claim 17, wherein the impedance component is formed as part of an integrated circuit in an integrated circuit package.

19. The method according to claim 16, wherein the injection signal has a selected frequency and/or frequency band.

20. The method according to claim 16, further including employing a sense resistor coupled to the first I/O pin.

21. The method according to claim 16, wherein the monitoring module further includes a rectifier coupled to the filter module.

22. The method according to claim 21, wherein the rectifier comprises a synchronous rectifier.

23. The method according to claim 16, further including employing a voltage divider component coupled to the signal source.

24. The method according to claim 16, wherein the monitoring module is further configured to discriminate signals not in the same frequency and/or phase with the injected signal.

25. The method according to claim 16, further including employing an integrated circuit die disposed between a die paddle and a first conductive plate, a dielectric plate disposed between the first conductive plate and a second conductive plate, wherein the first and second conductive plates and the dielectric plate forms a capacitor coupled to the first I/O pin.

26. The method according to claim 25, further including employing a first bond pad disposed on the second conductive plate, wherein the first bond pad is coupled to the first I/O pin.

27. The method according to claim 25, further including employing a connection from the second I/O pin to a second bond pad on the integrated circuit die.

28. An integrated circuit package, comprising:
- a first I/O pin configured to be coupled to an insulative material;
- a second I/O pin configured to output an insulation fault signal; and
- a monitoring means coupled to the first I/O pin for detecting a leakage current on the first I/O pin corresponding to an injected signal into the insulative material by a signal source,
- wherein the monitoring means comprises a filter module and a current detection for detecting a leakage current on the first I/O pin corresponding to an injected signal into the insulative material by a signal source and an output module for outputting an active state on the insulation fault signal when the leakage current is greater than a given threshold.

\* \* \* \* \*